(12) United States Patent
Mori et al.

(10) Patent No.: US 8,063,397 B2
(45) Date of Patent: Nov. 22, 2011

(54) SEMICONDUCTOR LIGHT-EMITTING STRUCTURE AND GRADED-COMPOSITION SUBSTRATE PROVIDING YELLOW-GREEN LIGHT EMISSION

(75) Inventors: Michael J. Mori, Cambridge, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 127 days.

(21) Appl. No.: 11/823,860

(22) Filed: Jun. 28, 2007

(65) Prior Publication Data

US 2008/0149915 A1  Jun. 26, 2008

Related U.S. Application Data

(60) Provisional application No. 60/816,933, filed on Jun. 28, 2006.

(51) Int. Cl.
*H01L 29/06* (2006.01)
(52) U.S. Cl. ........ 257/18; 257/80; 257/97; 257/E21.125
(58) Field of Classification Search .................... 257/80, 257/E21.125, 18, 97
See application file for complete search history.

(56) References Cited

U.S. PATENT DOCUMENTS

| | | | |
|---|---|---|---|
| 4,665,415 A | | 5/1987 | Esaki et al. |
| 4,719,155 A | * | 1/1988 | Matsumoto .................. 428/700 |
| 4,944,811 A | * | 7/1990 | Sukegawa et al. ........... 148/33.1 |
| 5,202,895 A | * | 4/1993 | Nitta et al. ................. 372/45.01 |
| 5,221,413 A | | 6/1993 | Brasen et al. |
| 5,374,564 A | | 12/1994 | Bruel |
| 5,442,205 A | | 8/1995 | Brasen et al. |
| 5,534,713 A | | 7/1996 | Ismail et al. |
| 5,638,392 A | * | 6/1997 | Ramdani et al. ........... 372/45.01 |
| 5,714,395 A | | 2/1998 | Bruel |
| 5,810,924 A | | 9/1998 | Legoues et al. |
| 5,882,987 A | | 3/1999 | Srikrishnan |
| 6,039,803 A | | 3/2000 | Fitzgerald et al. |
| 6,107,653 A | | 8/2000 | Fitzgerald et al. |
| 6,184,111 B1 | | 2/2001 | Henley et al. |
| 6,219,365 B1 | * | 4/2001 | Mawst et al. ............. 372/46.016 |
| 6,291,321 B1 | | 9/2001 | Fitzgerald |
| 6,335,264 B1 | | 1/2002 | Henley et al. |
| 6,391,740 B1 | | 5/2002 | Cheung et al. |

(Continued)

FOREIGN PATENT DOCUMENTS

EP                0 683 522 A2    11/1995

(Continued)

OTHER PUBLICATIONS

Agarwal et al., "Efficient production of silicon-on-insulator films by co-implantation of He+ with H+," *Appl. Phys. Lett.*, Mar. 2, 1998, pp. 1086-1088, vol. 72, No. 9.

(Continued)

*Primary Examiner* — Wael Fahmy
*Assistant Examiner* — John C Ingham
(74) *Attorney, Agent, or Firm* — Wolf, Greenfield & Sacks, P.C.

(57) ABSTRACT

Semiconductor light-emitting structures are shown on engineered substrates having a graded composition. The composition of the substrate may be graded to achieve a lattice constant on which a yellow-green light-emitting semiconductor material may be disposed. In some embodiments, the structure may be substantially free of aluminum.

37 Claims, 8 Drawing Sheets

U.S. PATENT DOCUMENTS

| | | | |
|---|---|---|---|
| 6,458,723 | B1 | 10/2002 | Henley et al. |
| 6,472,685 | B2 | 10/2002 | Takagi |
| 6,500,732 | B1 | 12/2002 | Henley et al. |
| 6,503,773 | B2 | 1/2003 | Fitzgerald |
| 6,518,644 | B2 | 2/2003 | Fitzgerald |
| 6,548,382 | B1 | 4/2003 | Henley et al. |
| 6,632,724 | B2 | 10/2003 | Henley et al. |
| 6,645,829 | B2 | 11/2003 | Fitzergald |
| 6,677,192 | B1 | 1/2004 | Fitzgerald |
| 6,682,965 | B1 | 1/2004 | Noguchi et al. |
| 6,723,622 | B2 | 4/2004 | Murthy et al. |
| 6,805,744 | B2 * | 10/2004 | Kim et al. .................. 117/94 |
| 6,852,556 | B2 | 2/2005 | Yap |
| 6,987,286 | B2 * | 1/2006 | McGill et al. ................ 257/97 |
| 2002/0008289 | A1 | 1/2002 | Murota et al. |
| 2002/0011628 | A1 | 1/2002 | Takagi |
| 2002/0105015 | A1 | 8/2002 | Kubo et al. |
| 2002/0140031 | A1 | 10/2002 | Rim |
| 2002/0197803 | A1 | 12/2002 | Leitz et al. |
| 2003/0025131 | A1 | 2/2003 | Lee et al. |
| 2003/0057416 | A1 | 3/2003 | Currie et al. |
| 2003/0218189 | A1 | 11/2003 | Christiansen et al. |
| 2004/0026765 | A1 | 2/2004 | Currie et al. |
| 2004/0074866 | A1 | 4/2004 | Fournel et al. |
| 2004/0087117 | A1 | 5/2004 | Leitz et al. |
| 2004/0121507 | A1 | 6/2004 | Bude et al. |
| 2004/0178406 | A1 | 9/2004 | Chu |
| 2005/0020094 | A1 | 1/2005 | Forbes et al. |
| 2005/0205954 | A1 | 9/2005 | King et al. |
| 2005/0247926 | A1 | 11/2005 | Sun et al. |
| 2005/0250294 | A1 | 11/2005 | Ghyselen |
| 2006/0001088 | A1 | 1/2006 | Chan et al. |
| 2006/0049409 | A1 | 3/2006 | Rafferty et al. |
| 2006/0055800 | A1 | 3/2006 | Ackland et al. |
| 2007/0105335 | A1 * | 5/2007 | Fitzgerald .................. 438/405 |

FOREIGN PATENT DOCUMENTS

| | | |
|---|---|---|
| GB | 2 365 214 A | 2/2002 |
| WO | WO 98/59365 A1 | 12/1998 |
| WO | WO 99/53539 A1 | 10/1999 |
| WO | WO 01/00522 A2 | 1/2001 |
| WO | WO 01/99169 A2 | 12/2001 |
| WO | WO 03/103031 A2 | 12/2003 |
| WO | WO 2004/006327 A2 | 1/2004 |
| WO | WO 2004/021420 A2 | 3/2004 |

OTHER PUBLICATIONS

Armstrong et al., "Design of Si/SiGe heterojunction complementary metal-oxide-semiconductor transistors," *IEEE, Electronic Devices Meeting*, 1995, pp. 31.1.1-31.1.4.

Aubertine et al. "Observation and modeling of the initial fast interdiffusion regime in Si/SIGe multilayers", *J. Appl. Phys.*, Nov. 1, 2002, pp. 5027-5035, vol. 92, No. 9.

Bruel, "Silicon on insulator material technology", *Electronics Letters*, Jul. 6, 1995, pp. 1201-1202, vol. 31, No. 14.

Cheng et al., "Electron mobility enhancement in strained-Si n-MOSFETs fabricated on SiGe-on-insulator (SGOI) substrates," *IEEE Electronic Device Letters*, Jul. 2001, pp. 321-323, vol. 22, No. 7.

Cheng et al., "Relaxed silicon-germanium on insulator (SGOI)," *Mater. Res. Soc. Symposium Proc.*, Nov. 26-28, 2001, pp. A1.5.1-A1.5.6, vol. 686.

Cheng et al., "Relaxed silicon-germanium on insulator substrate by layer transfer," *J. Electronic Materials*, Dec. 2001, pp. L37-L39, vol. 30, No. 12.

Cheng et al., "SiGe-on-insulator (SGOI): Substrate preparation and MOSFET fabrication for electron mobility evaluation," *IEEE International SOI Conference*, Oct. 1-4, 2001, pp. 13-14.

Corni et al., "Helium-implanted silicon: A study of bubble precursors", *J. Appl. Phys.*, Feb. 1, 1999, pp. 1401-1408, vol. 85, No. 3.

Corni et al., "Vacancy-gettering in silicon: cavities and helium implantation," *Solid State Phenomema*, 1999, pp. 229-234, vol. 69-70.

Currie et al., "Controlling threading dislocation densities in Ge on Si using graded SiGe layers and chemical-mechanical polishing," *Appl. Phys. Lett.*, Apr. 6, 1998, pp. 1718-1720, vol. 72, No. 14.

Currie, et al., "Carrier mobilities and process stability of strained Si n- and p-MOSFETs on SiGe virtual substrates," *J. Vac. Sci. Technol. B*, Nov. 2001, pp. 2268-2279, vol. 19, No. 6, American Vacuum Society.

Fitzgerald et al., "Dislocations in relaxed SiGe/Si heterostructures," *International Conference on Extended Defects in Semiconductors* (EDS' 98), *J. Phys. Stat. Sol.* A, Sep. 6-11, 1998, pp. 227-238, vol. 171, No. 1, Wiley-VCH, Germany.

Fitzgerald et al., "Dislocation dynamics in relaxed graded composition semiconductors," *Materials Science and Engineering*, 1999, pp. 53-61, vol. B67.

Fitzgerald et al., "Totally relaxed $Ge_xSi_{1-x}$ layers with low threading dislocation densities grown on Si substrates," *Appl. Phys. Lett.*, Aug. 12, 1991, pp. 811-813, vol. 59, No. 7, American Institute of Physics.

Friedman et al., "A proposed electroabsorption modulator at 1.55 μm in silicon/silicon-germanium asymmetric quantum-well structures," *IEEE Photonics Technology Letters*, Oct. 1993, pp. 1200-1202, vol. 5, No. 10.

Fu et al. Quantum mechanical description of p-type $Si/Si_{1-x}Ge_x$ quantum well MOSFET in silicon-on-insulator technology; *Solid-State Electronics*, 1997, pp. 729-732, vol. 41, No. 5.

Gracias et al., "Experiments on silicon-to-silicon direct Bonding," *XIII Meeting of the Brazilian Vacuum Society*, Jul. 1998, pp. 19-22; Campinas, Brazil.

Griglione et al., "Diffusion of Ge in $Si_{1-x}Ge_x$/Si single quantum wells in inert and oxidizing ambients," *J. Appl. Phys.*, Aug. 1, 2000, pp. 1366-1371, vol. 88, No. 3.

Griglione et al, "Diffusion of single quantum well $Si_{1-x}Ge_x$/Si layers under vacancy supersaturation," *J. Appl. Phys.*, Mar. 1, 2001, pp. 2904-2906, vol. 89, No. 5.

Gupta et al., "Improved hole mobilities and thermal stability in a strained-Si/strained-$Si_{1-y}Ge_y$/strained-Si heterostructure grown on a relaxed $Si_{1-x}Ge_x$ Buffer," *Appl. Phys. Lett.*, May 3, 2005, pp. 192104-1-192104-3, vol. 86, No. 19, American Institute of Physics.

Holländer et al., "Interdiffusion and thermally induced strain relaxation in strained $Si_{1-x}Ge_x$/Si superlattices," *Physical Review B*, Sep. 15, 1992, pp. 6975-6981, vol. 46, No. 11.

Johnson, "Mechanism for hydrogen compensation of shallow-acceptor impurities in single-crystal silicon," *Phys. Rev. B*, Apr. 15, 1985, pp. 5525-5528, vol. 31, No. 8.

Känel et al., "Very high hole mobilities in modulation-doped Ge quantum wells grown by low-energy plasma enhanced chemical vapor deposition," *Appl. Phys. Lett.*, Apr. 22, 2002, pp. 2922-2923, vol. 80, No. 16.

Kim et al. "Fabrication of thin film transistors using a $Si/Si_{i-x}Ge_x$/Si triple layer film on a $SiO_2$ substrate," *IEEE Electron Device Letters*, May 1996, pp. 205 207, vol. 17, No. 5.

Langdo et al., "SiGe-Free strained Si on insulator by wafer bonding and layer transfer," *App. Phys. Lett.*, Jun. 16, 2003, pp. 4256-4258, vol. 82, No. 24, American Institute of Physics, Melville, NY, US.

Lauer et al., "Fully depleted n-MOSFETs on supercritical thickness strained SOI," *IEEE Electron Device Letters*, Feb. 2004, pp. 83-85, vol. 25, No. 2.

Lee et al., "Strained Ge channel p-type metal-oxide-semiconductor field-effect transistors grown on $Si_{1-x}GE_x$/ Si virtual substrates," *Appl. Phys. Lett.*, Nov. 12, 2001, pp. 3344-3346, vol. 79, No. 20.

Lee et al., "Strained Ge channel p-type MOSFETs fabricated on $Si_{1-x}GE_x$//Si virtual substrates," *Mater. Res. Soc. Symp Proc.*, Nov. 26-28, 2001, pp. A1.9.1-A1.9.5, vol. 686.

Leitz et al., "Dislocation glide and blocking kinetics in compositionally graded SiGe/Si," *J. App. Phys.*, Sep. 15, 2001, pp. 2730-2736, vol. 90, No. 6, American Institute of Physics.

Liu et al., "Micromechanism fabrication using silicon fusion bonding," *Robotics and Computer Integrated Manufacturing*, 2001, pp. 131-137, vol. 17.

Liu et al., "High-quality Ge films on Si substrates using Sb surfactant-mediated graded SiGe buffers," *Appl. Phys. Lett.*, Nov. 19, 2001, pp. 3431-3433, vol. 79, No. 21.

Liu et al., "A high-speed silicon optical modulator based on a metal-oxide-semiconductor capacitor," *Nature*, Feb. 12, 2004, pp. 615-618, vol. 427, Nature Publishing Group.

Madhavi et al., "Low-and high-field transport properties of modulation-doped Si/SiGe and Ge/SiGe heterostructures: Effect of phonon confinement in germanium quantum wells," *Physical Review B*, Jun. 15, 2000, pp. 807-818, vol. 61, No. 24.

Myers et al., "Interaction of copper with cavities in silicon," *J. Appl. Phys.*, Feb. 1, 1996, pp. 1337-1350, vol. 79, No. 3.

Nayak et al., "Hole confinement in a Si/GeSi/Si quantum well on SIMOX," *IEEE Trans. on Electron Devices*, Jan. 1, 1996, pp. 180-182, vol. 43, No. 1.

Pitera et al., "Coplanar integration of lattice-mismatched semiconductors with silicon by wafer bonding Ge/Si$_{1-x}$Ge$_x$/Si Virtual Substrates," *J. Electrochem. Soc.*, 2004, pp. G443-G447, vol. 151, No. 7.

Raineri et al., "Gettering of metals by voids in silicon," *J. Appl. Phys.* 78, Sep. 15, 1995, pp. 3727-3735, vol. 78, No. 6.

Sadek et al, "Si/SiGe CMOS possibilities," *Solid-State Electronics*, 1995, pp. 1731-1734, vol. 38, No. 9.

Sadek et al., "Design of Si/SiGe heterojunction complementary metal-oxide-semiconductor transistors," *IEEE Trans. Electron Devices*, Aug. 1996, pp. 1224-1231, vol. 43, No. 8.

Sieg et al., "High minority-carrier lifetimes in GaAs grown on low-defect-density Ge/GeSi/Si substrates," *Appl. Phys. Lett.*, Nov. 23, 1998, pp. 3111-3113, vol. 73, No. 21, American Institute of Physics.

Taraschi et al., "Relaxed SiGe on insulator fabricated via wafer bonding and layer transfer: Etch-back and smart-cut alternatives," *Proceedings of the Tenth International Symposium (Electrochemical Society Proceedings)*, Mar. 25-29, 2001, pp. 27-32, vol. 2001-3, Electrochemical Soc., Pennington, NJ, US.

Taraschi et al., "Strained Si, SiGe, and Ge on-insulator: review of wafer bonding fabrication techniques," *Solid-State Electronics*, 2004, pp. 1297-1305, vol. 48.

Taraschi et al., "Strained-Si-on-Insulator (SSOI) and SiGe-on-Insulator (SGOI): Fabrication obstacles and solutions," *Mat. Res. Soc. Symp. Proc.*, Dec. 2-4, 2002, pp. N4.7.1-N4.7.6, vol. 745.

Taraschi et al., "Ultrathin strained Si-on-insulator and SiGe-on-insulator created using low temperature wafer bonding and metastable stop layers," *J. Electrochem. Soc.*, 2004, pp. G47-G56, vol. 151, No. 1.

Taraschi, "Strained Si-on-insulator development accelerates," *J: Compound Semiconductor*, Apr. 2003, pp. 25-27, vol. 9, No. 3, Franklin Publishing, US.

Taraschi, et al., "Relaxed SiGe-on-insulator fabricated via wafer bonding and etch back," *J. Vac. Sci. and Technol. B*, Mar. 2002, pp. 725-726, vol. 20, No. 2, American Vacuum Society.

Tong et al., "A "smarter-cut" approach to low temperature silicon layer transfer," *Appl. Phys. Lett.*, Jan. 5, 1998, pp. 49-51, vol. 72, No. 1.

Tsu, "Silicon-based quantum wells," *Nature, Scientific Correspondence*, Jul. 1, 1993, p. 19, vol. 364.

Ulyashin et al., "The hydrogen gettering at post-implantation hydrogen plasma treatments of helium- and hydrogen implanted Czochralski silicon," *Materials Science and Engineering*, 2000, pp. 64-68, vol. B73.

Usenko et al., "Transformation of hydrogen trapped onto microbubbles into H platelet layer in SI," *J. Materials Science: Materials in Electronics*, 2003, pp. 305-309, vol. 14.

Xiao, "Quantum confinement effects in strained silicon-germanium alloy quantum wells", *Appl. Phys. Lett.*, Apr. 27, 1993, pp. 2135-2137, vol. 60, No. 17.

Yonenaga, "Growth and mechanical properties of GeSi bulk crystals," *J. Materials Science: Materials in Electronics*, 1999, pp. 329-333, vol. 10.

Yousif et al., "Threshold voltage and charge control considerations in double quantum well Si/Si$_{1-x}$Ge$_x$ p-type MOSFETs", *Solid-State Electronics*, 1998, vol. 42, pp. 951-956, No. 6.

Zeindl et al, "Influence of interdiffusion and surfactants on Si/SiGe heterointerfaces", *Applied Surface Science*, 1996, 102, pp. 107-111; vol. 102.

Zeindl et al, "Diffusion phenomena in MBE grown Si/SiGe single quantum wells studied by PL and TEM measurements", *Applied Surface Science*, 1996, pp. 552-556, vol. 92.

Zelikson et al., "Threshold and saturation effects for photosignals in an amorphous silicon waveguide structure," *App. Phys. Lett.*, Nov. 18, 1991, pp. 2660-2662, vol. 59, No. 21, American Institute of Physics.

Erratum of B9, *Journal of Materials Science Materials in Electronics*, ISSN 0957-4522, Oct. 2002, p. 621, vol. 13, No. 10.

International Search Report for PCT/US2005/021281, mailed Mar. 29, 2006.

International Search Report for PCT/US2005/021283, mailed Oct. 28, 2005.

International Search Report and Written Opinion for PCT/US2005/035595, mailed Feb. 15, 2006.

International Search Report and Written Opinion for PCT/US2005/042865, mailed Jul. 13, 2006.

* cited by examiner

SEMICONDUCTOR LIGHT-EMITTING STRUCTURE AND GRADED-COMPOSITION SUBSTRATE PROVIDING YELLOW-GREEN LIGHT EMISSION

RELATED APPLICATIONS

This application claims the benefit under 35 U.S.C. §119 (e) of U.S. Provisional Application Ser. No. 60/816,933, entitled "AL-FREE INGAP-BASED LASER AND LED HETEROSTRUCTURE ON A LATTICE MISMATCHED SUBSTRATE," filed on Jun. 28, 2006, which is hereby incorporated by reference in its entirety.

FEDERALLY SPONSORED RESEARCH

This invention was made with U.S. Government support under contract B-12-M06-52. The U.S. Government has certain rights to this invention.

BACKGROUND

1. Technical Field

The techniques described herein relate to semiconductor light-emitting structures capable of emitting light in the yellow-green portion of the visible electromagnetic spectrum, substrates on which such structures may be formed, and methods for fabricating such structures.

2. Discussion of Related Art

Currently, light-emitting semiconductor technology lacks a commercially viable materials system for green emission, as no green group III-V semiconductor lasers with pure emission (e.g., not frequency doubled) are known to have been previously demonstrated. (As used herein, "green" emission refers to the yellow-green portion of the visible electromagnetic spectrum). Light-emitting devices including aluminum in their active region, such as (Al)InGaN-based light-emitting devices (LEDs) on small lattice constant substrates (e.g., sapphire) and AlInGaP LEDs on GaAs substrates (e.g., epitaxially grown on GaAs substrates), lack the efficiency of other emitters.

An efficient yellow-green or green emitter with a comparable efficiency to blue and red emitters does not yet exist. Materials that currently dominate the LED market have not demonstrated very good performance in the yellow-green part of the spectrum, as illustrated in FIG. 1. This problem is colloquially known as the "green gap." These wavelengths are significant because displays that emit yellow-green light appear much brighter than other colors for a given power output, because the human eye is most sensitive to the yellow-green portion of the visible light spectrum. As illustrated in FIG. 1, previous devices emitting in the yellow-green wavelength range of about 500-600 nm do not approach the 10%-20% power conversion efficiencies available at longer and shorter wavelengths.

In the GaN material system, green emission can be achieved through the use of InGaN quantum well or quantum dot layers. However, despite the very short minority carrier lifetimes induced by the quantum wells, the high dislocation density present in GaN layers combined with the inability to add enough indium (In) to form deep quantum wells (due to InGaN—GaN lattice-mismatch and thermodynamic constraints) can result in lower efficiency as compared with typical blue emission performance.

Another material system that has been considered for yellow-green emission is AlInGaP. Compositions of AlInGaP with a direct band gap can be used as the active material of a light-emitting device such as a laser diode or light-emitting diode (LED). Previously, compositions of AlInGaP that are lattice matched to GaAs (having a lattice constant of 0.5565325 nm) have been used to produce red to green light emitters. As the emitted wavelength becomes smaller (e.g., greener, rather than redder), larger band gap active regions must be used, reducing the available electronic and optical confinement in the devices and thus making them less efficient.

Green-emitting AlInGaP devices that are lattice-matched to GaAs have poor internal quantum efficiency due to the proximity of the indirect-direct bandgap crossover at the compositions of interest, as well as due to oxygen-related defects. Some of the shorter wavelength AlInGaP devices with at least minimal brightness operate in the range of 500 to 600 nm. These 500-600 nm devices often have very poor color purity, leading to an undersaturated appearance. This is a particular problem in the green region, where a deviation of as little as 2 nm may be discernable to the human eye.

The prediction of the electronic structure of AlInGaP alloys is quite complex. Little agreement exists in the literature regarding electronic parameters such as deformation potentials and band offsets. Even the exact values of $\Gamma$ and $X$ band gaps and the compositions of alloys at which indirect-direct crossovers occur are contested. Especially with compositions of the alloy far away from the lattice constant of GaAs, it is currently difficult to accurately predict the electronic structure of light-emitting designs.

A need therefore exists for semiconductor light-emitting structures capable of efficiently emitting light in the yellow-green portion of the electromagnetic spectrum.

SUMMARY

Such a need is addressed by the present invention. A first aspect discussed below is a device for emitting light. The device may include a substrate having a first region with a graded composition of a semiconductor material (e.g., GaAsP or InGaP) such that a lattice constant of the first region varies within the first region. The composition is graded along a thickness of the first region. The device may also include a semiconductor light-emitting structure in contact with the substrate and having a lattice constant that is approximately matched to a lattice constant of the substrate at an interface between the semiconductor light-emitting structure and the substrate.

Another aspect relates to a device for emitting light in the yellow-green portion of the visible light spectrum. The device may include a semiconductor light-emitting structure that is substantially aluminum-free. The light-emitting structure may include a quantum well region comprising InGaP or similar material and a confinement heterostructure forming the boundaries of the quantum well region. The confinement heterostructure may include InGaP or similar material of a different composition than the material of the quantum well region.

Still another aspect is a method(s) for fabricating such devices, substantially as presented below.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Applicants have appreciated that by relaxing the constraint that the light-emitting semiconductor material (e.g., AlInGaP or InGaP) be lattice-matched to GaAs, it is possible to use compositions of these semiconductor materials with a larger band gap in the yellow-green portion of the visible electromagnetic spectrum. In inorganic materials systems, Applicants believe the inability to achieve efficient yellow-green emission may be a result of a lattice-mismatch problem, as the lattice constant of AlInGaP and InGaP desirable for yellow-green light emission is different from that of common substrate materials, such as GaAs. By using compositions of AlInGaP or InGaP that are not lattice-matched to GaAs, high-efficiency yellow-green emission can be achieved by choosing compositions of these materials that provide more desirable electrical and optical confinement. One difficulty with this approach, however, has been the prevalence of crystal defects resulting from the growth of a lattice-mismatched material. However, in some embodiments, careful control of defects in the substrate can enable the growth of AlInGaP and InGaP alloys with non-conventional lattice constants.

Substrates can be developed that enable the formation of such AlInGaP and InGaP alloys on conventional substrate materials such as substrates that include GaAs, Si, Ge and/or GaP, for example. In some embodiments, these substrates include a region of semiconductor materials having a composition graded along the thickness of the region such that the lattice constant of the substrate changes along its thickness. Thus, a lattice constant different from the underlying semiconductor may be realized, providing a suitable platform for an efficient AlInGaP or InGaP light-emitting structure.

One aspect of forming an LED and/or laser diode heterostructure(s) with AlInGaP is growing high quality crystals at the above-mentioned compositions. This is, in turn, dependent on having high quality substrates with the desired lattice constant. In some embodiments, a substrate providing a lattice constant(s) different from that of a GaAs lattice may be a suitable host for an efficient yellow-green light-emitting heterostructure. Such heterostructures can be fabricated on either the larger-lattice-side or smaller-lattice-side of GaAs, resulting in efficient InGaP and/or AlInGaP heterostructures emitting in the yellow and green regions of the spectrum.

In some embodiments, a low-defect density substrate platform includes alloys of InGaP or GaAsP substrates of graded composition, such that a lattice constant in the range of about 0.55-0.565 nm is reached. A substrate with a lattice constant in this range may provide a suitable platform for AlInGaP or InGaP alloys of the same lattice constant, which, in turn, may be suitable for efficient yellow-green light emission.

Figure 1:
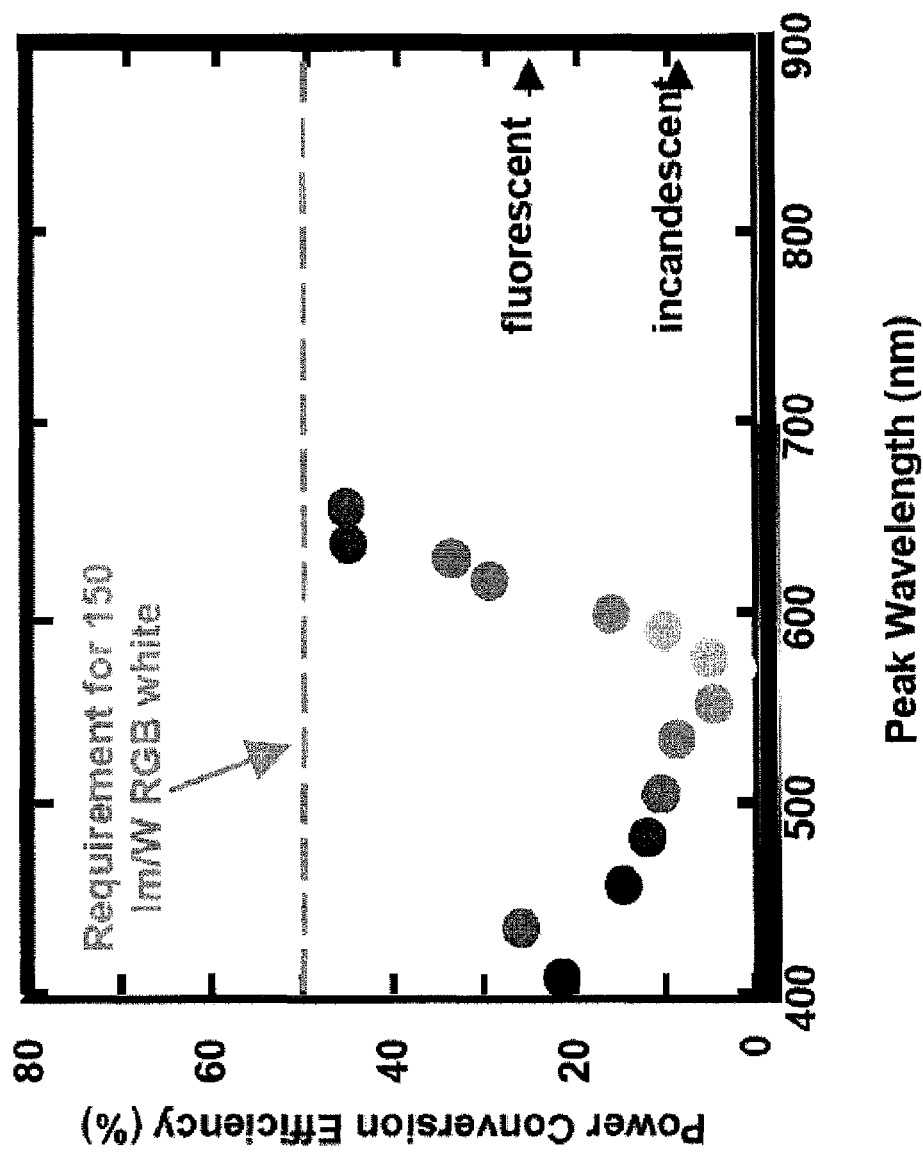
FIG. 1 is a plot of the efficiency of various light-emitting devices across the visible electromagnetic spectrum.
Figure 2:
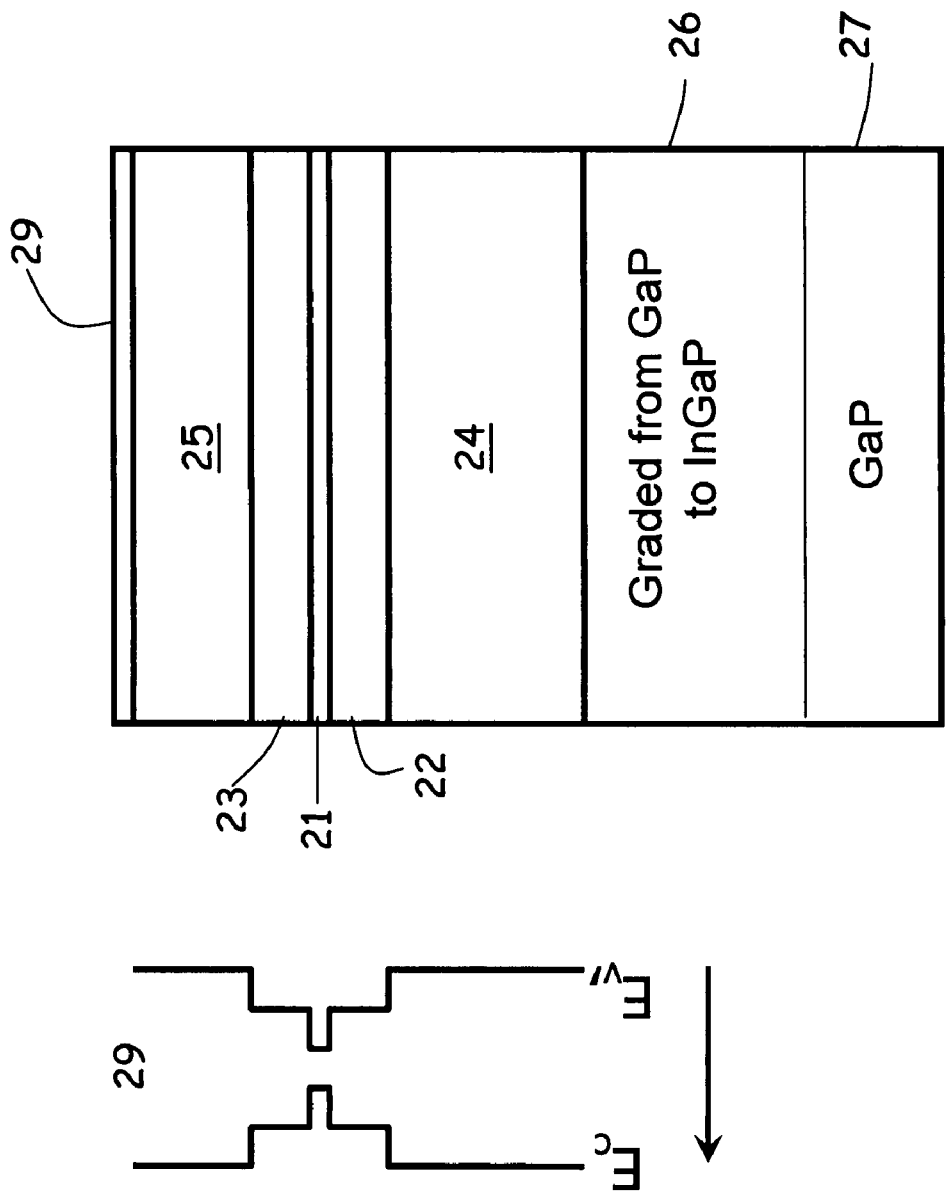
FIG. 2 is a cross-sectional diagrammatic illustration of a device for emitting light, according to some aspects and embodiments discussed herein, having a graded InGaP substrate region formed over a GaP region.

Applicants' previous attempts to form such substrates included implementing compositional grading on GaP substrates via InGaP. FIG. 2 illustrates one such embodiment of a device that includes semiconductor light-emitting structure 21-25. Light-emitting structure 21-25 may be a heterostructure formed of at least two different types of semiconductors and/or semiconductor compositions, and may include a semiconductor suitable for yellow-green light emission, such as AlInGaP. Light emitting structure 21-25 may include a strained quantum well 21, a separate confinement heterostructure 22, 23 (SCH) and cladding layers 24, 25. In some embodiments, quantum well 21 and separate confinement heterostructure 22, 23 may be undoped. Cladding layers 24, 25 may be doped to opposite conductivity types (e.g., P or N) such that light-emitting structure 21-25 is a light-emitting PIN diode.

FIG. 2 also illustrates a plot 29 of the valance band and the conduction band corresponding to the type of device illustrated in FIG. 2. The energy band plots are oriented sideways to align with the corresponding structure shown on the right side of FIG. 2. As illustrated by the valence-conduction band alignment in plot 29, device heterostructure 21-25 may have a type-I band offset, in some embodiments.

Light-emitting structure 21-25 may be formed on a substrate 26, 27 using epitaxy or another suitable technique. In the type of embodiment illustrated in FIG. 2, a region 26 of graded InGaP composition may be grown on a GaP region 27 (e.g., a GaP wafer). By growing layers with increasing In/Ga ratio in InGaP, crystal defects were confined in the growth plane (at the layer interfaces), while the lattice constant of the growing crystal was systematically increased. While Applicants were successful at providing a template for mismatched epitaxy of AlInGaP alloys on GaP, threading dislocation defect densities (TDDs) in the final crystals were still relatively high at $7 \times 10^6$ cm$^{-2}$. Applicants therefore concluded that defects induced by the segregation of the group III elements in InGaP leads to escalation of threading defect densities.

Figure 3:
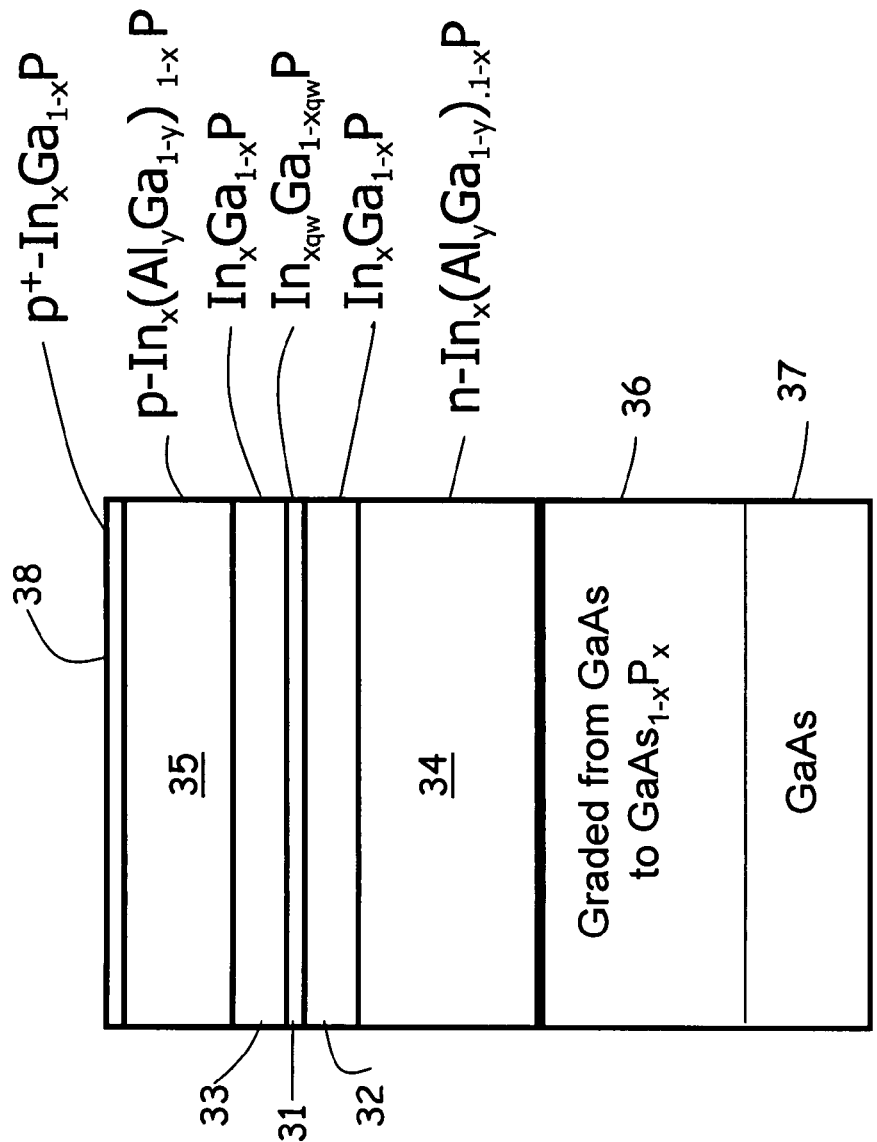
FIG. 3 is a cross-sectional diagrammatic illustration of a device for emitting light, according to some aspects and embodiments discussed herein, having a graded GaAsP substrate region formed over a GaAs region.

In some embodiments, an improved technique is provided using a modified compositional grading technique to grow GaAsP on GaAs. FIG. 3 illustrates one such embodiment, in which a graded GaAsP region 36 is grown on a GaAs region 37 with an increasing P/As ratio above the GaAs region 37. By avoiding a mixed-III compound and utilizing a tensile grading as opposed to a compressive grading, the threading dislocation density of graded GaAs$_{1-x}$P$_x$ substrates can be made no greater than about $1 \times 10^4$ cm$^{-2}$. By growing GaAs$_{1-x}$P$_x$ with an increasing P/As ratio, the grown layers may be formed with less surface roughness than for the compressive films in InGaP systems. The graded GaAsP (e.g., on a GaAs substrate) may have a top composition with a corresponding lattice constant matching the lattice constant of a desired InGaP layer (e.g., In$_{0.28}$Ga$_{0.72}$P) to be grown on the top of the graded GaAsP.

In some embodiments, the device may include a strained quantum well 31, a separate confinement heterostructure 32, 33 and cladding layers 34, 35. The bottom clad layer 34 that may be lattice-matched to the underlying substrate 36, 37 (e.g., a substrate including a graded GaAsP region 26 on a GaAs region 27) and can have the highest band gap of the device heterostructure. This bottom clad material 34 can also have the highest conduction band edge of the device heterostructure, so that, with a properly aligned quantum well, the electron confinement can be sufficient to provide efficient recombination in the quantum well. The bottom clad layer 34 may be epitaxially grown over the underlying substrate 36, 37 (e.g., a substrate including a graded GaAsP structure on GaAs). In some embodiments, the bottom clad layer 34 may include $In_x(Al_yGa_{1-y})_{1-x}P$. In one example, x=0.29 and y=0.3. This is just one example of a bottom clad layer, and it should be appreciated that y may be adjusted to tailor band alignment and the band gap (e.g., increase the band gap) and x may be tailored to adjust the lattice constant and band gap.

A bottom SCH layer 32 may be epitaxially grown over the bottom clad layer 34, and lattice-matched to the bottom clad layer. However, the techniques described herein are not limited to epitaxy or any other growth technique, as any suitable material deposition or growth technique may be used. In some such embodiments, the device includes SCH layers 32, 33 and quantum well regions 31 which are free of aluminum. Using present consensus values for band parameters of AlInGaP, Applicants have performed calculations of the band structure of light-emitting devices in accordance with some embodiments presented herein. Based on a band structure calculation, the addition of aluminum to a lattice constant range of interest (e.g., 0.556-0.565 nm) can lead to an undesirable type-II offset. To obtain a type-I device, the aluminum content of the material can be limited. In some embodiments, the device heterostructure 31-35 may have a type-I band offset.

In some embodiments, an LED and/or laser diode can include an undoped single SQW heterostructure based on one or more of the structures described herein. A substrate on which the heterostructure may be epitaxially grown may include graded GaAsP on a GaAs substrate, with the graded GaAsP having a top composition with a lattice constant of about 0.5567 nm. In one embodiment, the cladding layers may include unstrained $In_{0.28}Ga_{0.72}P$ cladding layers which are free of significant amounts of aluminum. In one embodiment, the lower and upper SQW layers may be formed of $In_{0.34}Ga_{0.66}P$ layers with a thickness of about 7.5 nm and having no significant amount of aluminum.

The bottom SCH layer 32 may be grown with y=0 (e.g., aluminum free), which may prevent oxygen-related defects in the active region. However, this is just an example, and some aluminum may be added to optimize the overall band structure. In some embodiments, the bottom SCH layer 32 may be formed of $In_xGa_{1-x}P$. In one such embodiment, x=0.29. However, this is just one example of a bottom SCH layer 32, and it should be appreciated that other suitable x values may be used.

The strained quantum well (QW) may be formed of $In_xGa_{1-x}P$ at a composition that results in a direct semiconductor bandgap and may be the lowest band gap material in the device. The value of x in the QW may be close enough to that in the SCH such that the QW layer can be grown below the critical thickness for dislocation nucleation. It should also be appreciated that the QW may be replaced with a multiple quantum well (MQW) structure, in some embodiments, which may increase the intensity of light emission.

The device structure may further include a top SCH layer 33 epitaxially (or otherwise) grown over the QW, and a top clad layer epitaxially (or otherwise) grown over the top SCH layer. In some embodiments, the top SCH layer 33 may be formed of the same material as the bottom SCH layer 32, and top clad layer 35 may be formed of the same material as the bottom clad layer 34. The underlying substrate 36, 37 (e.g., including a portion of graded region 36) and/or the lower clad layer may be n-type doped, the top clad layer 35 may be p-type doped, and the SCH and quantum well structures may be undoped (intrinsic composition). A top layer 38 may include a thin, highly-doped, p-type contact layer which may be lattice-matched InGaP, and which can serve to protect aluminum-containing portions (e.g., if any aluminum is present) of the device from oxidation in ambient air.

Figure 4:
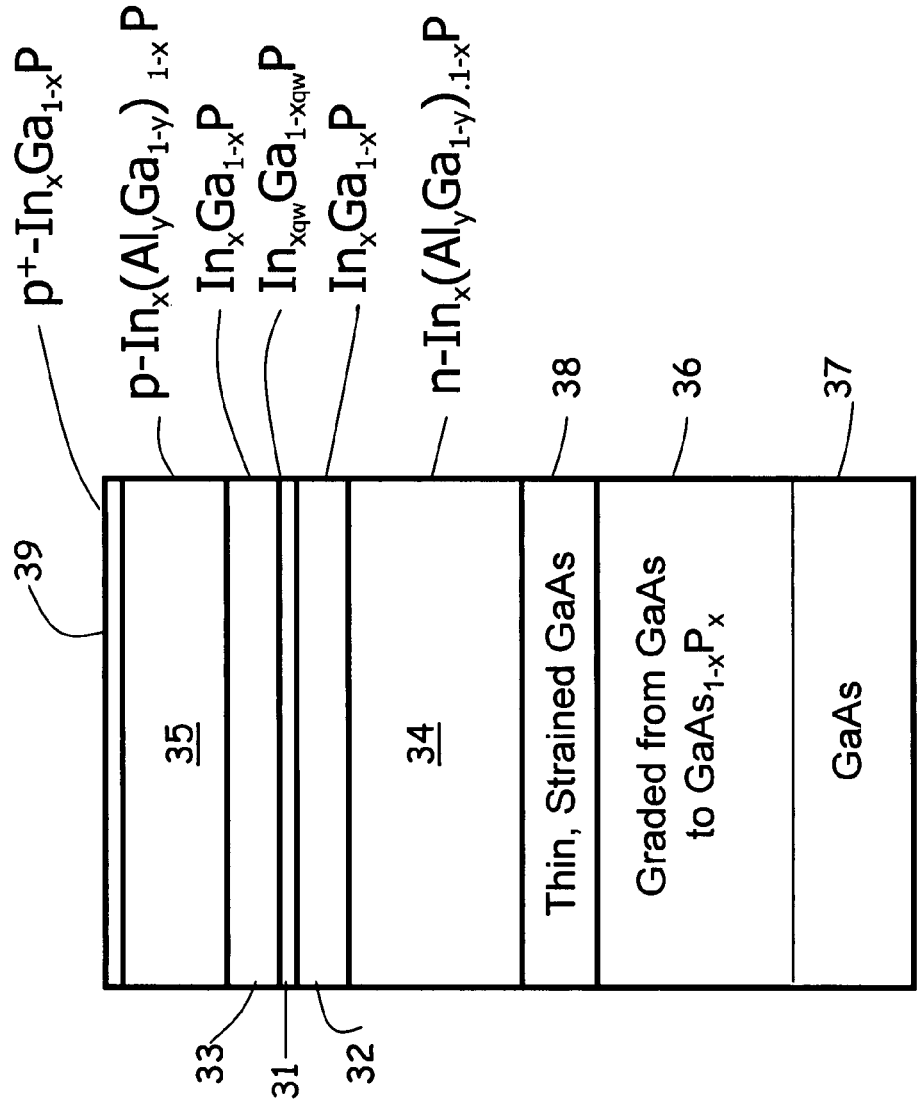
FIG. 4 is a cross-sectional diagrammatic illustration of a device for emitting light, according to some aspects and embodiments discussed herein, having a graded GaAsP substrate region and an intermediary region.

Applicants have appreciated that the upper surface of the graded region 36 may have an undesirable surface roughness on its upper surface, in some circumstances. Surface roughness may appear during cooling of the substrate surface due to intrinsic film stress. Applicants have developed techniques that Applicants believe reduces the surface roughness or at least mitigates its effect to some extent. One technique involves growing or depositing a thin semiconductor layer (e.g., of GaAs or another material) on top of the graded layer prior to cooling. Thus, as illustrated in FIG. 4 an intermediary layer 38 may be formed between the graded semiconductor region 36 and the light-emitting structure 31-35. Intermediary layer 38 may act as a buffer between graded semiconductor region 36 and bottom clad region 34. In some embodiments, intermediary layer may be a thin strained layer of GaAs.

In some embodiments, an intermediary layer 38 may not be used, and graded semiconductor region 36 may be in contact with light-emitting structure 31-35, such that an interface is formed therebetween. As an example, one technique for reducing and/or mitigating the surface roughness includes growing the graded semiconductor layer and the light-emitting structure in a continuous epitaxial growth process, such that the deposited material is changed as the growth process continues to run. For example, the substrate may not be cooled prior to growth of the semiconductor light-emitting structure. Once the growth of graded semiconductor region 36 is finished, the growth of a bottom clad layer 34 may be started shortly thereafter so that the surface of region 36 is stabilized, thereby reducing the number of defects that may be present during the grown of bottom clad layer 34. Such an embodiment is illustrated in FIG. 3, in which an intermediary layer is not included. However, it should be appreciated that either of these techniques may be used to reduce and/or mitigate the surface roughness, if desired in any of the types of embodiments illustrated in FIGS. 2-6, as the techniques described herein are not limited in this respect.

Figure 5:
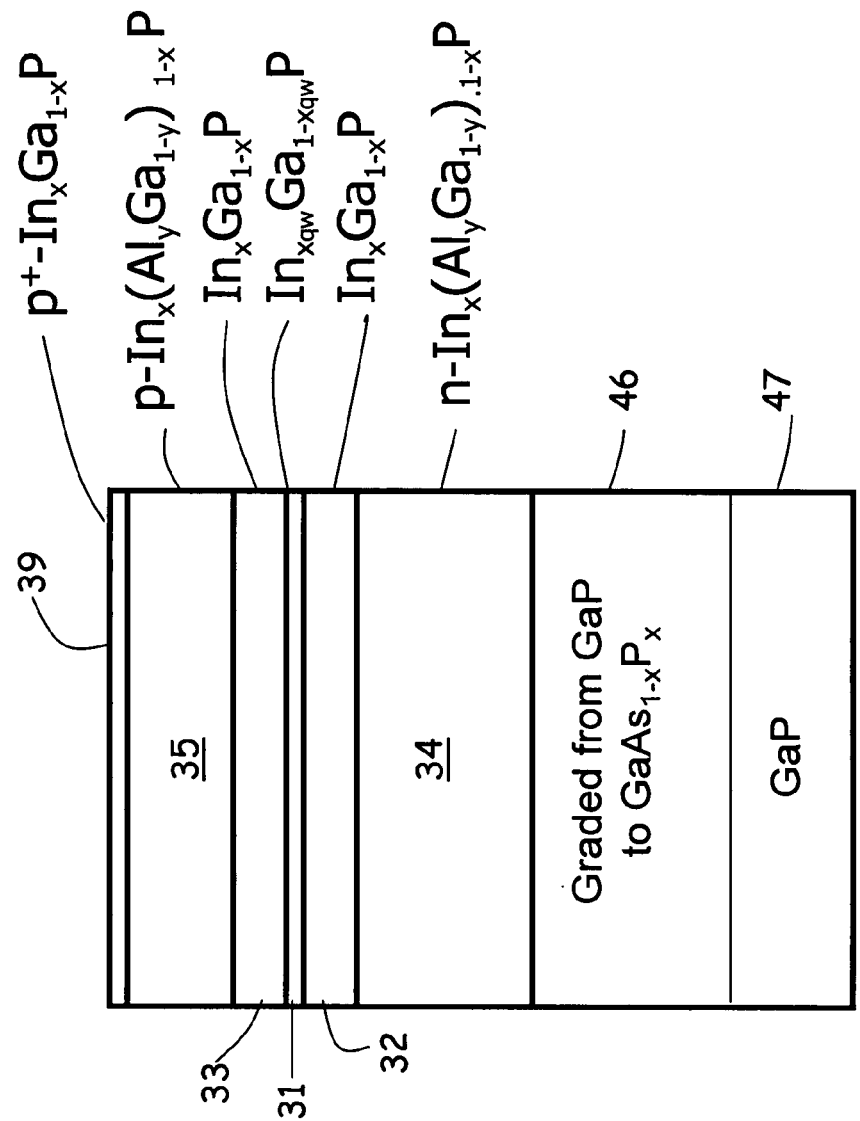
FIG. 5 is a cross-sectional diagrammatic illustration of a device for emitting light, according to some aspects and embodiments discussed herein, having a graded GaAsP substrate region formed over a GaP region.

In some embodiments, a compositional grading technique may be used to grow GaAsP on GaP by adding increasing amounts of As. One such embodiment is illustrated in FIG. 5, which shows a device that includes a GaP region 47 (e.g., a GaP wafer) and a GaAsP region 46 formed thereon. In some embodiments, the GaAsP region 46 may be epitaxially grown on to GaP region 47. GaAsP region 46 may have a graded composition such that the ratio of As/P increases in the direction away from GaP region 47 as the GaAsP region 46 is formed. Any suitable compositional grading technique may be used to achieve a composition of GaAsP having a desired lattice constant and low defect density.

Other low-defect virtual substrate designs are also possible, including GaAsP on Si and Si on lattice-engineered substrates. By bringing high efficiency visible light-emitting structure designs to the Si platform, such structures can enable a host of other applications.

Figure 6:
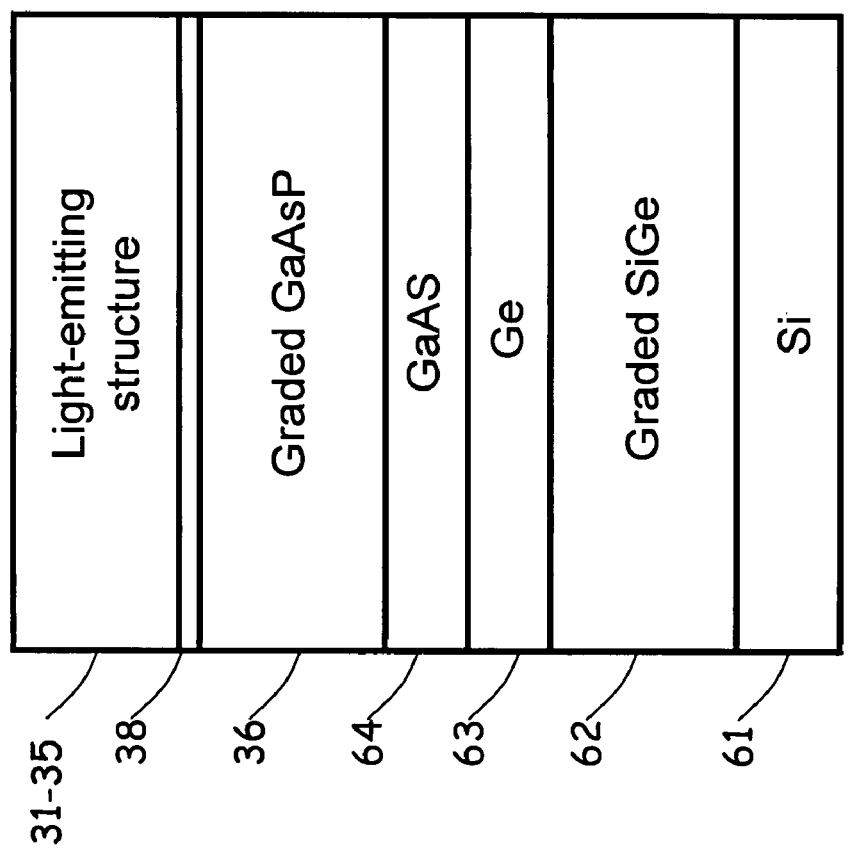
FIG. 6 is a cross-sectional diagrammatic illustration of a device for emitting light, according to some aspects and embodiments discussed herein, such that the device is formed over a silicon substrate.

In one type of embodiment illustrated in FIG. 6, a GaAsP graded buffer may be epitaxially grown over a GaAs/Si platform to provide a yellow-green light-emitting structure formed over silicon (e.g., a silicon wafer). Such a substrate may include a silicon (Si) region 61, a graded silicon-germanium (SiGe) region 62 which may have a composition that is graded to a region of pure germanium 63 (Ge), a lattice-matched GaAs layer 64 deposited over the Ge region, a graded GaAsP region 36 which may be graded to the lattice constant of interest for visible materials, an optional intermediary region 38 and, lastly, a lattice-matched AlInGaP and/or InGaP light-emitting structure 31-35. In some embodiments, the low defect density of the GaAsP graded buffer region 36 does not significantly increase the underlying defect density of the GaAs/Si. In some embodiments, the tensile nature of the GaAsP graded region 36 reduces the surface roughness of the overall structure. Thus, an AlInGaP or InGaP structure can be incorporated into a Si engineered substrate, and visible (e.g., yellow-green) light-emitting structures can thus be incorporated onto a silicon wafer.

Figure 7:
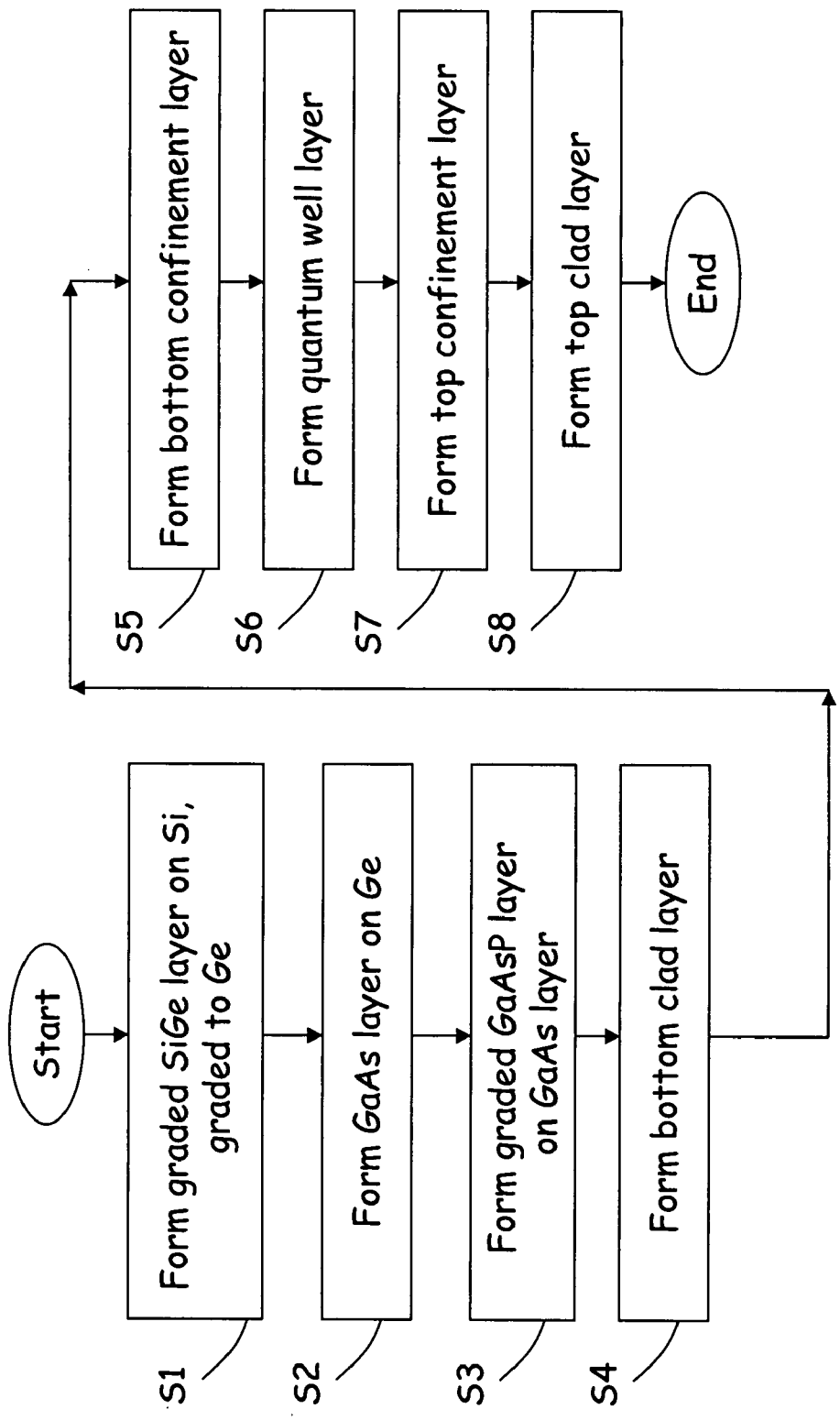
FIG. 7 is a flow chart illustrating a method of forming a device that includes a light-emitting structure on a suitable substrate, according to some embodiments.

FIG. 7 is a flow chart of a method of forming the type of device illustrated in FIG. 6. In some embodiments, a layer(s) may be formed such that the lattice constant is changed from a lattice constant of a first material (e.g., Si) to a latttice constant of another material (e.g., InGaP or AlInGaP having a composition suitable for yellow-green light emission). In step S1, a graded SiGe layer may be formed on a silicon substrate, for example, such that the composition is graded to pure Ge. In step S2, a GaAs layer may be formed. Then, in step S3, a graded GaAsP layer may be formed. At this point, a substrate suitable for supporting a yellow-green light-emitting structure has been provided. Next, in S4-S8, the yellow-green light-emitting structure may be formed. In some embodiments, each of these layer may be formed using an epitaxial growth technique, such as metalorganic chemical vapor deposition (MOCVD). However, the techniques described herein are not limited to epitaxial growth, as any suitable growth or deposition process may be used for the formation of the semiconductor material layers.

Figure 8:
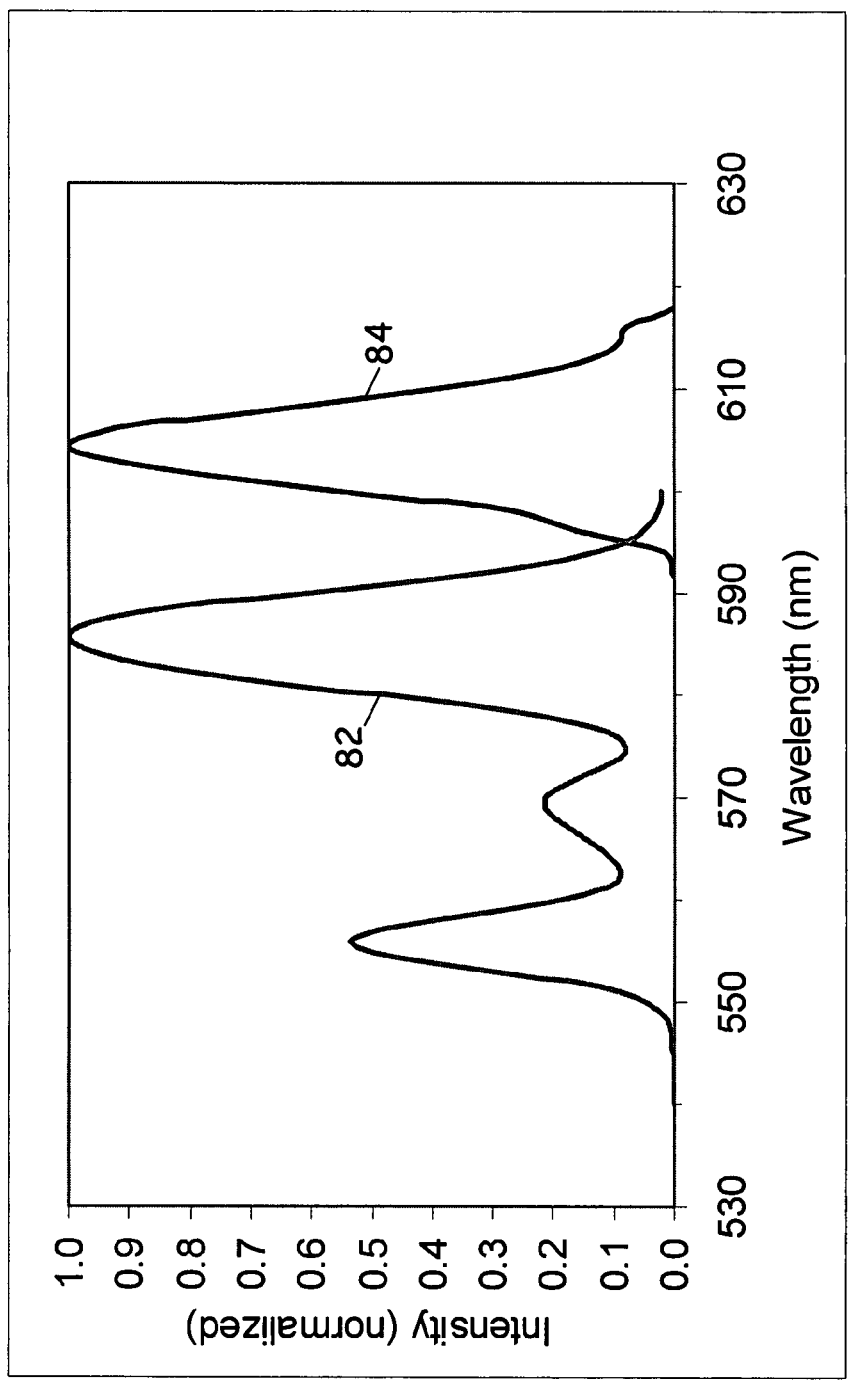
FIG. 8 is a plot showing measured yellow-green light emission achieved in a laboratory implementation using the techniques described herein.

FIG. 8 is a plot showing photoluminescence scans performed on the light output of devices formed according to the type of structure illustrated in FIG. 3. These scans were performed at a temperature of 120° K. Curve 84 is the result of a photoluminescence scan of a device with a single quantum well structure. Curve 82 is the result of a photoluminescence scan of a similar device, but having a multiple quantum well structure (e.g., three quantum wells) instead of a single quantum well structure. Curve 82 includes peaks at three different wavelengths, each corresponding to light emission from one of the three quantum wells. These structures show strong luminescence at a wide range of colors, from deep green to amber.

In some embodiments, a microelectronic circuit (e.g., a processor) may include optical interconnects which may replace some electrical interconnects. A potential economical platform for such a microprocessor can include Si CMOS electronics, Si p-i-n photodetectors, and III-V-based light emitters, all of which may be integrated on a Si substrate. To enable a high communication rate, the optical wavelength may be chosen to be in the yellow-green part of the visible spectrum. Thus, in one embodiment, the III-V-based light emitters may include AlInGaP structures, as discussed herein. Such monolithic integration of yellow-green emitters on Si may sustain Moore's law for microelectronic performance by alleviating electrical interconnect limitations.

In some embodiments, the integration of green light emitters on Si can also enable a host of other applications, including large-area or high-resolution displays with integrated electronics. Green semiconductor laser diodes would also be useful in medical, imaging and printing applications.

Various embodiments of the invention can facilitate the resolution of several previous barriers to integration of visible light-emitting materials and devices with silicon CMOS. The result may be the ability to create a high-density, visible LED array on Si using silicon-CMOS-compatible infrastructure and engineered substrate materials. Such an array has application, for example, in ultra-low cost displays, high-resolution low cost printer bars, novel imaging and printing engines, and low cost computer-on-chip products.

In some embodiments, materials advances presented herein and the evolution of silicon manufacturing technology can enable true monolithic integration of optoelectronics with digital silicon CMOS logic. The process can begin with the creation of novel engineered substrate materials in which a germanium lattice (lattice-matched to GaAs optoelectronic materials) can be integrated onto a silicon wafer. It is noted here that although Ge can be used for integrating GaAs-based materials and devices (as Ge is nearly lattice-matched to GaAs), materials with a variety of other lattice constants can be embedded in an engineered substrate. For example, a GaAs layer itself or an InP layer template could be the underlying lattice. Such a substrate can accommodate both silicon CMOS circuits as well as III-V optoelectronic devices. In the example of using Ge as the template, III-V device layers are deposited on the exposed Ge lattice in the engineered substrate at the optimum integration opportunity and returned to the silicon fabrication facility for final metallization.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A device for emitting light, the device comprising:
a substrate comprising a first region, the first region having a graded composition of GaAsP such that a lattice constant of the first region varies within the first region, the graded composition being graded along a thickness of the first region and having a threading dislocation density in the first region of less than about $7 \times 10^6 \text{cm}^{-2}$; and
a semiconductor light-emitting structure in contact with the substrate and having a lattice constant that is approximately matched to a lattice constant of the substrate at an interface between the semiconductor light-emitting structure and the substrate,
wherein the substrate further comprises:
a silicon region; and
a graded SiGe region disposed over the silicon region,
wherein the first region is disposed over the SiGe region.

2. The device of claim 1, wherein the semiconductor light-emitting structure is in contact with the first region at the interface between the semiconductor light-emitting structure and the substrate.

3. The device of claim 1, wherein at least a portion of the semiconductor light-emitting structure comprises a semiconductor material with a direct bandgap suitable for providing light emission in a yellow-green portion of the visible light spectrum.

4. The device of claim 3, wherein the semiconductor material comprises AlInGaP or InGaP.

5. The device of claim 3, wherein the composition of the first region is graded such that the lattice constant of the first region approaches, in the direction of the semiconductor light-emitting structure, the lattice constant of the semiconductor material.

6. The device of claim 1, wherein the semiconductor light-emitting structure comprises a quantum well region formed in a semiconductor material having a direct bandgap suitable for providing light emission in a yellow-green portion of the visible light spectrum.

7. The device of claim 6, wherein the semiconductor light-emitting structure further comprises a confinement heterostructure that forms the boundaries of the quantum well region.

8. The device of claim 7, wherein the semiconductor light-emitting structure further comprises:
a top clad layer in contact with the separate confinement heterostructure and doped to a first conductivity type; and
a bottom clad layer in contact with the separate confinement heterostructure and doped to a second conductivity type opposite to the first conductivity type.

9. The device of claim 8, wherein the bottom clad layer is in contact with the substrate at the interface.

10. The device of claim 1, wherein the semiconductor light-emitting structure is substantially aluminum-free.

11. The device of claim 10, wherein the substrate is substantially aluminum-free.

12. The device of claim 1, wherein the substrate further comprises
a germanium region disposed over the SiGe region.

13. The device of claim 1, wherein the first region is formed by metalorganic chemical vapor deposition.

14. The device of claim 1, further comprising an intermediary region of strained semiconductor between the substrate and the semiconductor light-emitting structure.

15. The device of claim 14, wherein the strained semiconductor comprises GaAs.

16. The device of claim 1, wherein the threading dislocation density in the first region is no more than about $1 \times 10^4$ cm$^{-2}$.

17. A device for emitting light in a yellow-green portion of the visible light spectrum, the device comprising:
a substrate;
a semiconductor light-emitting structure that is substantially aluminum-free, the semiconductor light-emitting structure being formed over the substrate, the semiconductor light-emitting structure comprising:
a quantum well region comprising InGaP; and
a confinement heterostructure forming the boundaries of the quantum well region, the confinement heterostructure comprising InGaP of a different composition than the InGaP of the quantum well region; and
an intermediary region of strained GaAs between the substrate and the semiconductor light-emitting structure.

18. The device of claim 17, wherein the confinement heterostructure comprises a top region and a bottom region that are both in contact with the quantum well region on opposite sides of the quantum well region.

19. The device of claim 18, further comprising:
a doped top clad region in contact with the top region of the confinement heterostructure; and
a doped bottom clad region in contact with the bottom region of the confinement heterostructure,
wherein the substrate comprises a graded GaAsP region that is in contact with the doped bottom clad region and that is lattice-matched to the doped bottom clad region.

20. The device of claim 17, wherein the substrate is lattice-matched to a portion of the semiconductor light-emitting structure in contact with the substrate.

21. The device of claim 20, wherein the substrate comprises a GaAsP region having a graded composition.

22. The device of claim 17, wherein the substrate comprises:
a silicon region; and
a graded SiGe region disposed over the silicon region,
wherein the intermediary region is disposed over the SiGe region.

23. The device of claim 17, wherein the substrate comprises:
a silicon region;
a graded SiGe region disposed over the silicon region; and
a germanium region disposed over the SiGe region,
wherein the intermediary region is disposed over the germanium region.

24. A device for emitting light, the device comprising:
a substrate comprising a first region, the first region having a graded composition of GaAsP such that a lattice constant of the first region varies within the first region, the graded composition being graded along a thickness of the first region and having a threading dislocation density in the first region of less than about $7 \times 10^6$ cm$^{-2}$;
a semiconductor light-emitting structure in contact with the substrate and having a lattice constant that is approximately matched to a lattice constant of the substrate at an interface between the semiconductor light-emitting structure and the substrate; and
an intermediary region of strained semiconductor between the substrate and the semiconductor light-emitting structure.

25. The device of claim 24, wherein the strained semiconductor comprises GaAs.

26. The device of claim 24, wherein the semiconductor light-emitting structure is in contact with the first region at the interface between the semiconductor light-emitting structure and the substrate.

27. The device of claim 24, wherein at least a portion of the semiconductor light-emitting structure comprises a semiconductor material with a direct bandgap suitable for providing light emission in a yellow-green portion of the visible light spectrum.

28. The device of claim 27, wherein the semiconductor material comprises AlInGaP or InGaP.

29. The device of claim 27, wherein the composition of the first region is graded such that the lattice constant of the first region approaches, in the direction of the semiconductor light-emitting structure, the lattice constant of the semiconductor material.

30. The device of claim 24, wherein the semiconductor light-emitting structure comprises a quantum well region formed in a semiconductor material having a direct bandgap suitable for providing light emission in a yellow-green portion of the visible light spectrum.

31. The device of claim 30, wherein the semiconductor light-emitting structure further comprises a confinement heterostructure that forms the boundaries of the quantum well region.

32. The device of claim 31, wherein the semiconductor light-emitting structure further comprises:
a top clad layer in contact with the separate confinement heterostructure and doped to a first conductivity type; and
a bottom clad layer in contact with the separate confinement heterostructure and doped to a second conductivity type opposite to the first conductivity type.

33. The device of claim 32, wherein the bottom clad layer is in contact with the substrate at the interface.

34. The device of claim 24, wherein the semiconductor light-emitting structure is substantially aluminum-free.

35. The device of claim 34, wherein the substrate is substantially aluminum-free.

36. The device of claim 24, wherein the first region is formed by metalorganic chemical vapor deposition.

37. The device of claim 24, wherein the threading dislocation density in the first region is no more than about $1 \times 10^4$ cm$^{-2}$.

* * * * *